(12) United States Patent
Carlson et al.

(10) Patent No.: US 8,481,122 B2
(45) Date of Patent: *Jul. 9, 2013

(54) METHODS OF FORMING MATERIAL OVER SUBSTRATES

(75) Inventors: Chris M. Carlson, Boise, ID (US); Vishwanath Bhat, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 1395 days.

This patent is subject to a terminal disclaimer.

(21) Appl. No.: 11/485,658

(22) Filed: Jul. 12, 2006

(65) Prior Publication Data

US 2006/0251813 A1 Nov. 9, 2006

Related U.S. Application Data

(63) Continuation of application No. 10/822,016, filed on Apr. 8, 2004, now abandoned.

(51) Int. Cl.
*C23C 16/40* (2006.01)

(52) U.S. Cl.
USPC ............. 427/255.31; 427/255.32; 427/255.34

(58) Field of Classification Search
USPC ............ 117/84, 88, 104; 427/255.31, 255.32, 427/255.34
See application file for complete search history.

(56) References Cited

U.S. PATENT DOCUMENTS

| 5,885,316 | A | * | 3/1999 | Sato et al. ........................ 65/324 |
| 6,007,875 | A | | 12/1999 | Grunwald et al. |
| 6,200,893 | B1 | * | 3/2001 | Sneh ............................. 438/685 |
| 6,355,561 | B1 | | 3/2002 | Sandhu et al. |
| 6,420,230 | B1 | * | 7/2002 | Derderian et al. ............. 438/255 |
| 6,785,120 | B1 | * | 8/2004 | Basceri et al. ................ 361/311 |
| 6,809,370 | B1 | | 10/2004 | Colombo et al. |
| 6,936,901 | B2 | | 8/2005 | Yamamoto |
| 7,135,421 | B2 | * | 11/2006 | Ahn et al. ..................... 438/785 |
| 7,151,039 | B2 | | 12/2006 | Lee et al. |
| 7,442,415 | B2 | * | 10/2008 | Conley et al. ............ 427/255.36 |
| 2003/0190424 | A1 | * | 10/2003 | Sneh ...................... 427/255.392 |
| 2003/0218221 | A1 | * | 11/2003 | Wager et al. .................. 257/410 |
| 2003/0227033 | A1 | * | 12/2003 | Ahn et al. ..................... 257/213 |
| 2004/0238872 | A1 | * | 12/2004 | Lee et al. ...................... 257/306 |

OTHER PUBLICATIONS

Katamreddy, Rajesh, et al., "Atomic layer deposition of HfO2, Al2O3, and HfAlOx using O3 and metal(diethylamino) precursors". J. Mater. Res., JMR Archives, Dec. 2007, no page numbers. Abstract Only.*

Joo, Moon Sig, et al., "Formation of Hafnium-Aluminum-Oxide Gate Dielectric Using Single Cocktail Liquid Source in MOCVD Process". IEEE Transactions on Electron Devices, vol. 50, No. 10, Oct. 2003, pp. 2088-2094.*

* cited by examiner

*Primary Examiner* — Bret Chen
(74) *Attorney, Agent, or Firm* — Wells St. John P.S.

(57) ABSTRACT

ALD-type methods which include providing two or more different precursors within a chamber at different and substantially non-overlapping times relative to one another to form a material, and thereafter exposing the material to one or more reactants to change a composition of the material. In particular aspects, the precursors utilized to form the material are metal-containing precursors, and the reactant utilized to change the composition of the material comprises oxygen, silicon, and/or nitrogen.

18 Claims, 5 Drawing Sheets

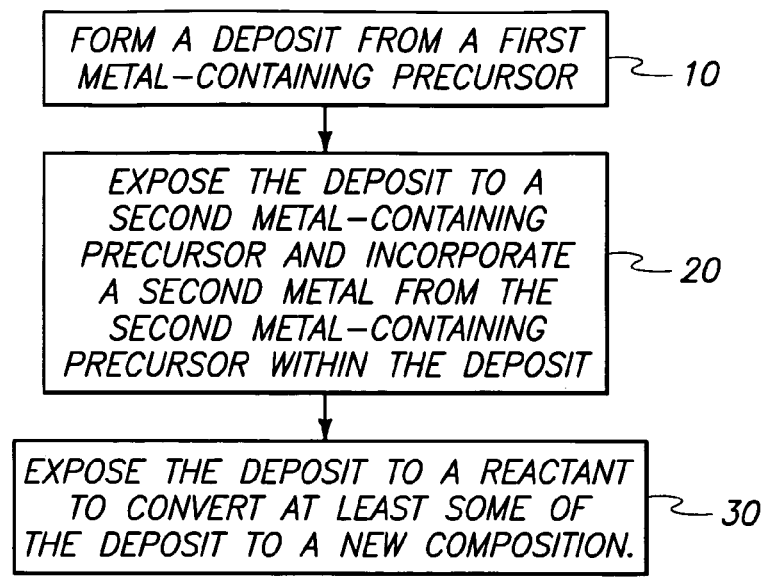
_F I G_ _1_
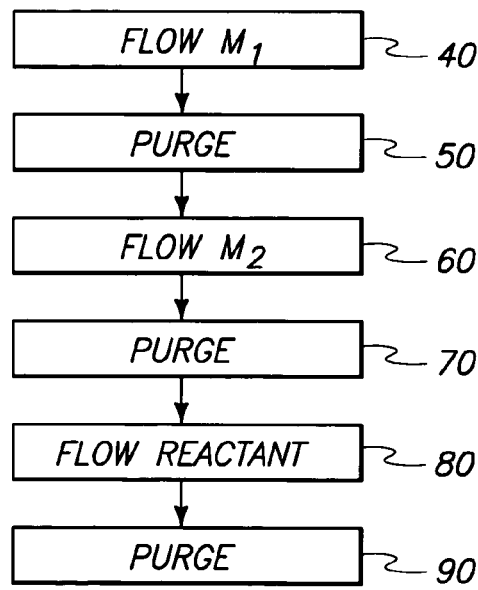
_F I G_ _2_
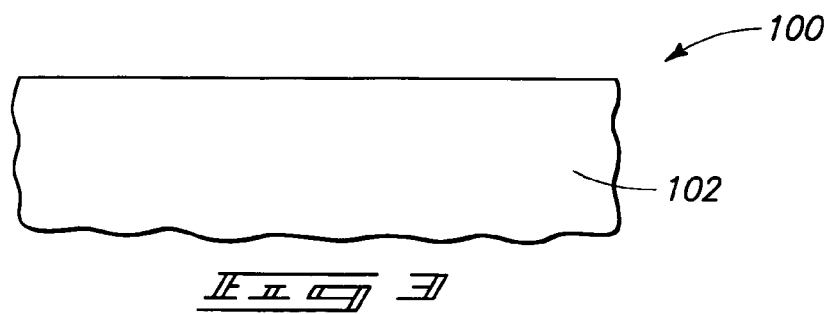
_F I G_ _3_

METHODS OF FORMING MATERIAL OVER SUBSTRATES

RELATED PATENT DATA

This patent resulted from a continuation application of U.S. patent application Ser. No. 10/822,016, which was filed Apr. 8, 2004 now abandoned, and is hereby incorporated by reference.

TECHNICAL FIELD

The invention pertains to methods of forming material over substrates, and in particular aspects pertains to methods of forming material over semiconductor substrates.

BACKGROUND OF THE INVENTION

Various technologies have been developed for applying thin films over substrates, and particularly for applying thin films during fabrication of semiconductor devices. Such technologies include chemical vapor deposition (CVD) and atomic layer deposition (ALD). ALD and CVD are similar to one another in that both comprise utilization of volatile precursor materials to form a desired deposit over a substrate. CVD and ALD differ from one another, however, in that CVD typically includes reaction of precursors in vapor phase over a substrate to form a desired deposit, whereas ALD typically comprises chemisorption of a precursor component onto a substrate followed by reaction with the chemisorbed component to form a desired deposit.

Specific attributes of typical ALD technology and typical CVD technology are described below. First, however, it is useful to provide definitions of particular terms utilized throughout this document. The deposition methods referred to herein can be described in the context of formation of materials on one or more semiconductor substrates. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements along with the portions of Groups IIIA to VIA designated as metals in the periodic table, namely, Al, Ga, In, TI, Ge, Sn, Pb, Sb, Bi, and Po. The lanthanides and actinides are included as part of Group IIIB; and the "lanthanides" and "actinides" are to be understood to include lanthanum and actinium, respectively. "Non-metals" refers to the remaining elements of the periodic table.

Next, referring to attributes of ALD technology, such can, but does not always, involve formation of successive atomic layers on a substrate. The layers may comprise, for example, an epitaxial, polycrystalline, and/or amorphous material. ALD may also be referred to as atomic layer epitaxy, atomic layer processing, etc.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps of utilizing the first and second species can be repeated with exposure of the second species monolayer to the first species. In some cases, the two monolayers may be of the same species. Also, a third species or more may be successively chemisorbed and purged just as described for the first and second species. It is noted that one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. It is further noted that local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

Referring next to CVD technology, such includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing/a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate. Such a condition may introduce intolerable defects into a deposited material.

Among the advantages of ALD-type technologies (with the term "ALD-type" referring to technologies that are either true ALD processes or that are more similar to ALD processes than to other deposition processes), is that such can theoretically be self-limiting processes. Specifically, a substrate exposed to appropriate precursor will only have a monolayer chemisorbed thereover, regardless of the length of time of the exposure or the quantity of precursor utilized in the exposure. In other words, the substrate can be exposed to an excess of precursor, and yet only a monolayer will be formed.

In practice, however, ALD-type procedures are frequently found to be less than completely self-limiting. If the substrate is exposed to a large excess of precursor, and/or exposed to precursor for an excessive period of time, stacking of the precursor will occur over the substrate so that a layer having at least some portions thicker than a monolayer results. This can be problematic, in that the thickened portions of the layer can adversely affect step coverage. For instance, it frequently desired to form monolayers extending into openings associated with semiconductor substrates. As the upper portions of the openings will generally be more readily exposed to precursor than the deeper portions of the openings, it is often found that ALD-type processes which are not truly self-limiting will form thickened regions at upper portions of the openings and thinner regions deeper within the openings. The thickened regions at the outer portions of the openings can be particularly problematic if the thickened regions become large enough to pinch off the tops of the openings. Accordingly, it is desired to develop methods by which self-limiting aspects of ALD processes can be enhanced.

SUMMARY OF THE INVENTION

In one aspect, the invention pertains to a method of forming a material over a substrate. The substrate is placed within a reaction chamber, and while the substrate is within the chamber at least one iteration of the following sequence is conducted. Initially, a first precursor is provided within the chamber and a first species is chemisorbed from the first precursor onto the substrate. Substantially all of the first precursor is then removed from within the reaction chamber. Subsequently, a second precursor is provided within the reaction chamber and a second species is sorbed from the second precursor in contact with the first species. The second precursor has a different composition than the first precursor. Next, substantially all of the second precursor is removed from within the reaction chamber, and thereafter a reactant is provided within the reaction chamber and reacted with at least one of the first and second species. Finally, substantially all of the reactant is removed from the reaction chamber.

In one aspect, the invention encompasses a method for forming a material over a substrate. The method includes providing the substrate within a reaction chamber and conducting the following sequence. Initially, two or more different metal-containing precursors are provided within the chamber at different and substantially non-overlapping times relative to one another to form a material over the substrate that comprises metals from the precursors. At least two of the metals within the material are different from one another. Subsequently, the material is exposed to one or more reactants, with at least one of the reactants interacting with at least one of the metals to change the composition of the material.

In one aspect, the invention encompasses a method in which a substrate is placed within a reaction chamber and exposed to at least one iteration of the following sequence. Initially, a first precursor is provided within the reaction chamber and a first component of a material is deposited from the first precursor. The first component comprises a first metal and forms a substantially saturated monolayer over the substrate. Next, substantially all of the first precursor is removed from within the reaction chamber. A second precursor is then provided within the reaction chamber and a second component of the material is deposited from the second precursor. The second component comprises a second metal different from the first metal. The second component integrates with the substantially saturated monolayer of the first component. Subsequently, substantially all of the second precursor is removed from within the reaction chamber. Finally, the material is exposed to one or more reactants to change the composition of the material.

BRIEF DESCRIPTION OF THE DRAWINGS

Preferred embodiments of the invention are described below with reference to the following accompanying drawings.

FIG. 1 is a flow-chart diagram of an exemplary aspect of the present invention.

FIG. 2 is a flow-chart diagram of another exemplary aspect of the present invention.

FIG. 3 is a diagrammatic, cross-sectional view of a substrate at a preliminary processing stage of an aspect of the present invention.

DETAILED DESCRIPTION OF THE PREFERRED EMBODIMENTS

Figure 4:
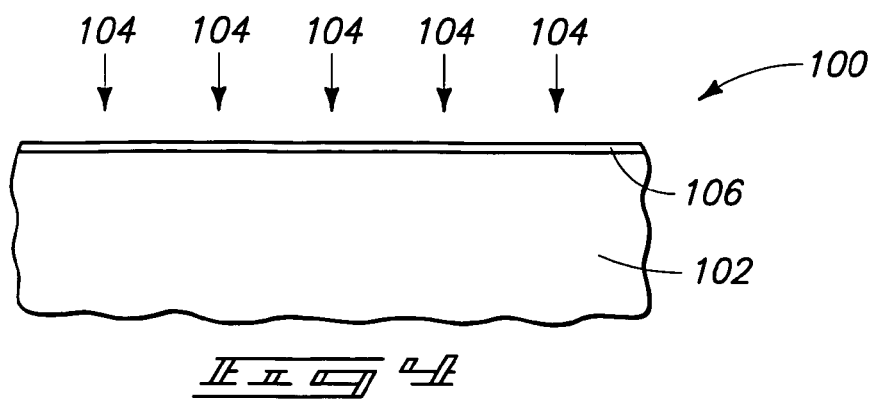
FIG. 4 is a view of the FIG. 3 substrate shown at a processing stage subsequent to that of FIG. 3.
Figure 5:
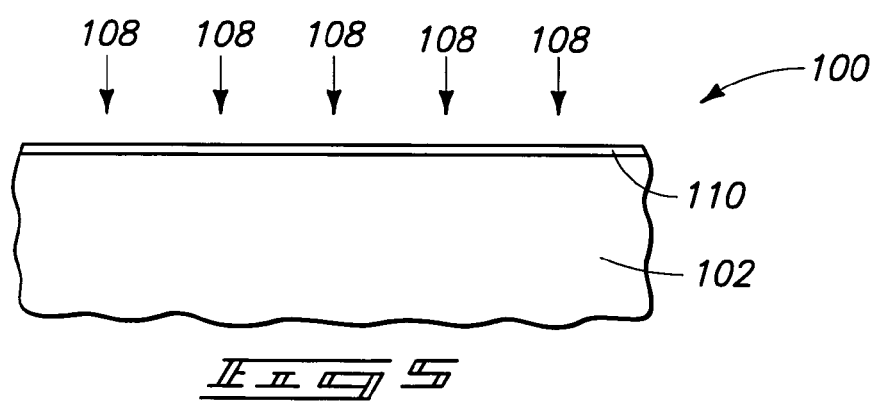
FIG. 5 is a view of the FIG. 3 substrate shown at a processing stage subsequent to that of FIG. 4.

This disclosure of the invention is submitted in furtherance of the constitutional purposes of the U.S. Patent Laws "to promote the progress of science and useful arts" (Article 1, Section 8).

A desired aspect of ALD-type processing is self-limiting adsorption of precursors on a substrate. Thus, if a metal-containing precursor (such as, for example, trimethyl aluminum (TMA), tetrakis-dimethylamino hafnium (TDMAH), tetrakis-methylethylamido hafnium (TMEAH), or $TiCl_4$ is exposed to a substrate, components of the precursor ideally adsorb until all available adsorption sites are taken and there is one monolayer of the precursor across all exposed surfaces of the substrate.

Some precursors tend to be primarily self-limiting (such as, for example, TMA), whereas other precursors are frequently not self-limiting (such as, for example, TMEAH). For precursors which are self-limiting, additional exposure to the precursor does not result in further adsorption. This self-limiting adsorption can lead to highly conformal films of the type desired from ALD-type processes. However, precursors which fail to exhibit self-limiting adsorption will frequently not produce the highly-conformal films desired.

One aspect of the invention is to enhance self-limiting adsorption of a poor self-limiting precursor by pulsing a good self-limiting precursor either before or after pulsing the poor self-limiting precursor. The combined pulses of the good and poor self-limiting precursors form a material comprising a mixture of components from the good and poor self-limiting precursors. The material can then be exposed to an appropriate reactant (such as, for example, oxygen, nitrogen or silicon) to convert the material to a desired composition (such as, for example, an oxide, a nitride, or a silicide).

In one facet of the invention, the good self-limiting adsorption precursor is utilized first. A substantial monolayer can be formed from such precursor with such monolayer effectively tying up surface adsorption sites and providing good step coverage across the substrate surface. The second precursor having poor self-limiting adsorption characteristics can then be pulsed. Exchange kinetics between the first and second precursors can populate the monolayer formed from the first precursor with components of the second precursor to create a material comprising a mixture of components from the first and second precursors. The monolayer formed from the first precursor can be considered to comprise a first species from the first precursor which is chemisorbed onto the underlying substrate, and the component from the second precursor can be considered to correspond to a second species sorbed within the chemisorbed material of the first species. The second species will thus be in contact with the first species. Generally, the first and second species will comprise differences relative to one another, and in particular aspects the first and second species can comprise different metals from one another. If both the first and second species comprise metals, the metals can be selected from the group consisting of aluminum, hafnium, lanthanides, niobium, tantalum, titanium, yttrium and zirconium. In some aspects one or both of the first and second species do not comprise metal. In such aspects one of the first and second species can comprise Si or Ge instead of metal. In a particular aspect, one of the first and second species comprises Si and the other comprises Ge.

Utilization of the exchange kinetics between the first and second precursors can be particularly useful when an intermediate composition between the primary deposition constituents of the first and second precursors is desired. The particular intermediate composition can be fixed by various parameters, including the exchange kinetics and the relative concentrations of the two precursors. Thus, compositional aspects can be varied by varying the number of cycles of one precursor relative to another, and/or by varying other parameters associated with the exposure of a substrate to the different precursors within a reaction chamber.

One specific example of a process of the present invention is to utilize a pulse of TMA within an ALD reaction chamber followed by a pulse of TMEAH, followed by a pulse of a desired reactant, such as, for example, $O_3$. The exemplary pulse sequence can be written as TMA-TMEAH-$O_3$, with such being a shorthand description of a process comprising a pulse/purge with TMA, followed by a pulse/purge with TMEAH, which in turn is followed by a pulse/purge with $O_3$. The shorthand description TMA-TMEAH-$O_3$ describes the relative order of the initial pulses of TMA, TMEAH and $O_3$ compared to one another. Thus, the sequence is stating that the initial pulse of TMA occurs before the initial pulses of TMEAH and $O_3$, and that the initial pulses of both TMA and TMEAH occur before the initial pulse of $O_3$. Other than the limitation of the relative order of the initial TMA pulse, TMEAH pulse and $O_3$ pulse, the shorthand description is not to be understood excluding additional intervening steps, unless such is specifically stated. Thus, the sequence TMA-TMEAH-$O_3$ is generic to numerous sequences, including, for example, TMA-TMEAH-TMA-$O_3$; TMA-TMEAH-TMA-TMEAH-$O_3$, etc. Further, the pulse sequence TMA-TMEAH-$O_3$ can be included with other pulse sequences, with an example of such inclusion being a pulse sequence of TMEAH-$O_3$-TMA-TMEAH-$O_3$. In some aspects, one or more of the TMEAH pulses can be replaced by pulses of TDMAH.

The TMEAH of the above-described sequences would typically not be thermally stable at deposition temperatures of greater than or equal to about 300° C., which would result in adsorption which is not self-limiting. However, by preceding the TMEAH pulse with a TMA pulse, the deposition rate of the TMEAH can be decreased, which can lead to reduced thermal decomposition and better step coverage.

Materials comprising mixtures of aluminum oxide and hafnium oxide have previously been produced with ALD processes. However, the typical ALD cycle for producing such materials would be a TMEAH pulse, purge, $O_3$ pulse, purge, TMA pulse, purge, $O_3$ pulse, purge, etc. Accordingly, each pulse of metal-containing precursor would be followed by a pulse of reactant. In contrast, the present invention pulses one of the metal-containing precursors (TMA or TMEAH), the other of the metal-containing precursors, and then the reactant. In an exemplary aspect in which the TMA pulse is utilized prior to the TMEAH pulse, the deposition rate of the combined TMA pulse and TMEAH pulse is about 1 Å per cycle. This is only slightly higher than the deposition rate for aluminum oxide formed using TMA and ozone, and is less than the rate of deposition of hafnium oxide formed from TMEAH and ozone (which is typically about 1.4 Å per cycle). The reduction in the deposition rate per cycle utilizing the TMA-TMEAH-$O_3$ cycle may evidence that the TMA has improved the self-limiting adsorption of the TMEAH.

If the order of the TMEAH pulse and TMA pulse is reversed (i.e., if the TMEAH pulse is performed first), the deposition rate jumps to about 2 Å per cycle, which is more than TMEAH and ozone alone. Regardless of the order in which the TMEAH pulse and TMA pulse are performed, measurements of materials formed with processing utilizing the two metal-containing precursor pulses followed by an ozone pulse show that the materials contain both aluminum oxide and hafnium oxide.

If it is desired to increase the amount of hafnium in a layer while utilizing the TMA-TMEAH-$O_3$ methodology described above, it may be desired to add additional TMEAH-$O_3$ cycles between TMA exposures. If the number of the additional TMEAH-$O_3$ cycles are small enough, the improved self-limitation may persist. The cycle would then be a TMA-(TMEAH-$O_3$)$_x$ cycle, where x is an integer greater than zero. Another type of pulse is TMA-TMEAH-$O_3$-TMEAH-TMA-$O_3$. Alternative pulse schemes can also be utilized in the methodology of the present invention.

The aspects described above may improve self-limiting adsorption of precursors under conditions in which the precursors would otherwise lack self-limiting adsorption characteristics. The ability of a precursor to maintain self-limitation with longer pulse times may enable the methodology of the present invention to be utilized in batch deposition systems, which can improve through-put relative to single-wafer tools.

In some aspects of the invention, the pulse sequence $M_1$-$M_2$-R is utilized, where $M_1$ is a first metal-containing precursor, $M_2$ is a second metal-containing precursor and R is a reactant. The pulse sequence forms a material having metal from both the first precursor ($M_1$) and the second precursor ($M_2$). The relative concentrations of metals from the first and second precursors can be controlled by numerous facets of the above-described processing. In one aspect, the relative amount of metal can be controlled by the order in which the precursors are pulsed. For instance, if one of the precursors is TMA and the other is TMEAH, the pulse sequence TMEAH-TMA-$O_3$ can produce a material having a higher relative amount of hafnium to aluminum than is produced by the pulse sequence is TMA-TMEAH-$O_3$. The amount of hafnium can be further increased by providing TMEAH-$O_3$ pulses after the $M_1$-$M_2$-$O_3$ pulse. For instance, the pulse sequence can comprise TMEAH-TMA-$O_3$-TMEAH-$O_3$, etc. Thus, it is to be understood that the relative amount of particular metals formed within materials produced in accordance with methodology of the present invention can be controlled by the order of precursor pulses and the relative frequency of particular precursor pulses.

A particular aspect of the invention is described with reference to FIG. 1. The methodology of FIG. 1 begins with step 10 of forming a deposit from a first metal-containing precursor. The deposit can be formed over any suitable substrate, including, for example, a semiconductor substrate. The deposit will comprise a species derived from the first metal-containing precursor, with such species containing metal from the first metal-containing precursor. The species formed from the first metal-containing precursor can be referred to as a first species to distinguish the species from other species formed subsequently, and the metal contained by the first species can be referred to as a first metal. In particular aspects, the first metal will be selected from the group consisting of aluminum, hafnium, lanthanides, niobium, tantalum, titanium, yttrium and zirconium. The deposit of step 10 can correspond to a chemisorbed layer of the first species, and in particular aspects can correspond to a substantially saturated monolayer formed over a suitable substrate.

A second step 20 of the FIG. 1 process comprises exposure of the deposit from step 10 to a second metal-containing precursor, and incorporation of a second metal from the second metal-containing precursor within the deposit. The incorporated material from the second metal-containing precursor can be referred to as a second species which contains a second metal. The second species corresponds to at least a portion of the second metal-containing precursor. The second species can be referred to as a component of the second metal-containing precursor, with the term "component" indicating that the second species contains at least a portion of the second metal-containing precursor, and accordingly contains all or some of the second metal-containing precursor. In particular aspects of the invention, the second metal can be selected from the group consisting of aluminum, hafnium, lanthanides, niobium, tantalum, titanium, yttrium and zirconium.

The final step 30 of the FIG. 1 process comprises exposure of the deposit to a reactant to convert at least some of the deposit to a new composition. The reacting can comprise, for example, one or more of oxygen, nitrogen and silicon, and accordingly the new composition can comprise one or more of oxide, nitride and silicide. The exposure of the deposit to the reactant can result in reaction of the reactant with one or both of the first and second metals. For instance, if the first and second metals comprise hafnium and aluminum, exposure of the deposit to an oxygen-containing reactant (such as, for example, ozone) can convert the deposit to material comprising one or both of aluminum oxide and hafnium oxide. Similarly, exposure of the deposit to a reactant comprising nitrogen (such as, for example, ammonia, hydrazine, monomethyl hydrazine, dimethyl hydrazine, etc.) can convert at least some of the deposit to a material comprising one or both of aluminum nitride and hafnium nitride; and exposure of the deposit to a reactant comprising silicon (such as, for example, silane or tri(dimethylamino) silane (TDMAS)) can convert at least some of the deposit to a composition comprising one or both of aluminum silicide and hafnium silicide.

In some exemplary aspects of the invention, other steps can be provided in addition to those shown in FIG. 1. For instance, FIG. 1 shows two metal precursors incorporated into a deposit prior to exposure to a reactant, and accordingly corresponds to a reaction sequence of $M_1$-$M_2$-R; where $M_1$ is a first metal-containing precursor, $M_2$ is a second metal-containing precursor, and R is a reactant. The methodology of FIG. 1 can be modified so that more than two metal-containing precursors are provided within a deposit prior to utilization of a reactant. Accordingly, the processing of FIG. 1 can be modified to correspond to ($M_1$-$M_2$- . . . $M_n$)-R, where additional metal-containing precursors are provided up until the $n^{th}$ metal-containing precursor ($M_n$), where n is an integer of at least 3, and then the reactant is utilized. In some aspects, all of the metals of the metal-containing precursors can be selected from the group consisting of aluminum, hafnium, lanthanides, niobium, tantalum, titanium, yttrium and zirconium.

Although the processing sequence of FIG. 1 utilizes two metal-containing precursors, it is to be understood that the invention also encompass aspects in which at least one of the precursors utilized prior to exposure to a reactant does not contain metal. Regardless of whether the precursor contains metal or not, a component of the precursor is incorporated into a layer comprising another component through sorbtion rather than through reaction. For instance, an exemplary precursor may contain silicon instead of metal.

The processing of FIG. 1 can be utilized as a single iteration for forming a desired composition. In some aspects, multiple iterations of the processing of FIG. 1 can be utilized to form a desired composition to a desired thickness.

Figure 11:
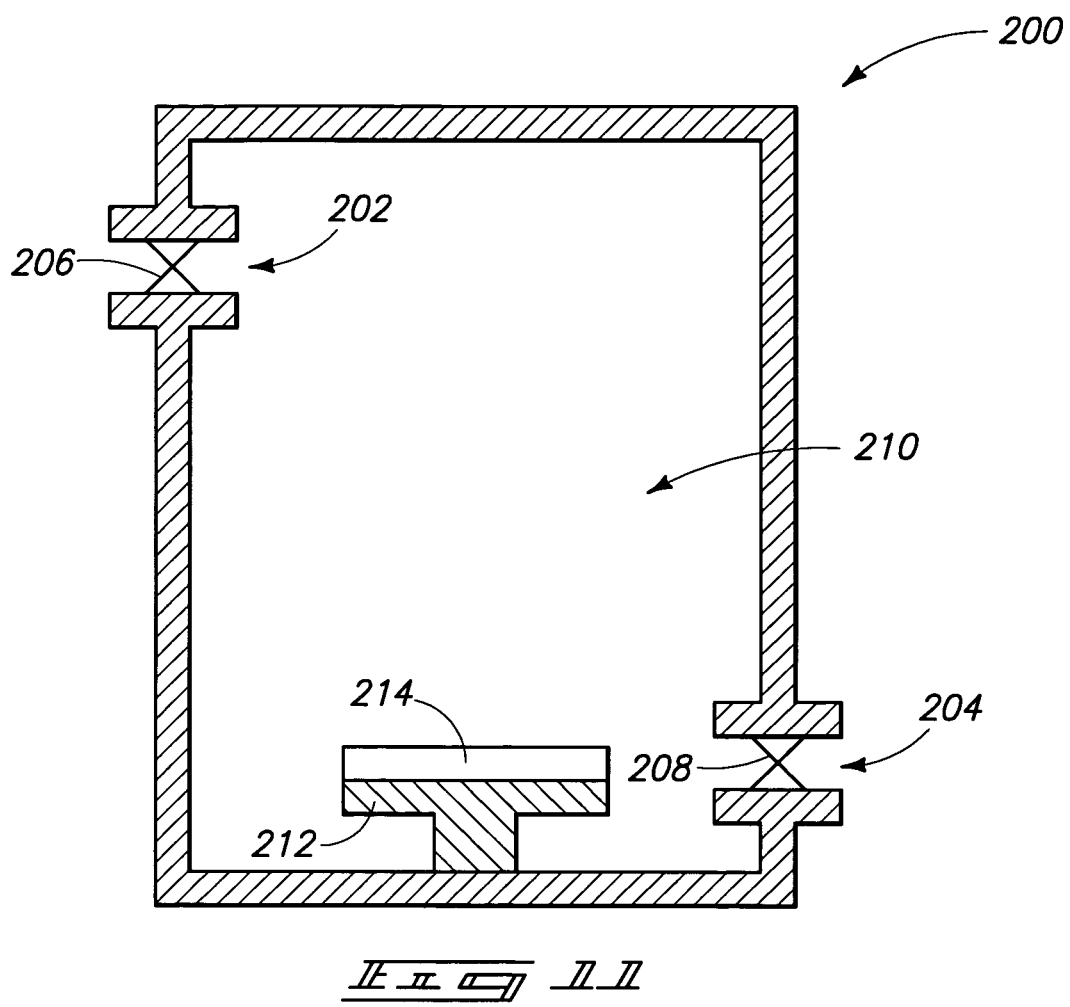
FIG. 11 is a diagrammatic, cross-sectional view of an exemplary reaction chamber which can be utilized in aspects of the present invention.

The methodology of FIG. 1 can be accomplished with an ALD-type process. FIG. 2 shows a flow-chart diagram describing an exemplary ALD-type process, and FIG. 11 shows an exemplary apparatus 200 which can be utilized. Referring initially to FIG. 11, apparatus 200 comprises a reaction chamber 210, and comprises an inlet 202 and an outlet 204 extending into the chamber. The inlet 202 has a valve 206 within it, and the outlet 204 has a valve 208 within it. The apparatus 200 also comprises a substrate holder 212 within the chamber, and a substrate 214 is shown supported by the holder 212.

In operation, materials are flowed into chamber 210 through inlet 202, and exhausted from the chamber through outlet 204. Apparatus 200 can be utilized for ALD-type procedures by providing precursors and reactants within the chamber at substantially non-overlapping times relative to one another. For instance, a first precursor can be flowed into the chamber through inlet 202 to a desired concentration within the chamber, and such concentration can be maintained within the chamber for a desired time. The first precursor can then be purged from the chamber through outlet 204. Such purging can be accomplished by flowing an inert purge gas through chamber 210 and additionally, or alternatively, utilizing vacuum to pull the first precursor out of chamber 210 through outlet 204. After the first precursor has been purged from within the chamber, a second precursor can be provided within the chamber to a desired concentration, and maintained at such concentration for a desired period of time. The second precursor can then be purged from within the chamber. Subsequently, a desired reactant can be provided within the chamber to a desired concentration which is maintained for a desired period of time, and the reactant can then be purged from within the chamber.

The purge of a particular material from the chamber typically removes substantially all of the material from within the chamber. The term "substantially all" is utilized to indicate that the amount of material within the chamber is reduced to a level where gas-phase reactions with subsequent materials do not degrade properties of a deposited layer formed over the substrate 214. The term "purging substantially all" of a material includes aspects in which the vast majority of material is removed from within a reaction chamber as well as aspects in which an entirety of the material is removed from within the reaction chamber, with a material being considered entirely removed from a reaction chamber if there is no detectable amount of the material remaining within the reaction chamber.

Two materials are considered to be present in the reaction chamber at different and substantially non-overlapping times relative to one another if substantially all of one of the materials is purged from within the reaction chamber prior to the provision of the other material within the reaction chamber. The materials are present in the reaction chamber at different and entirely non-overlapping times relative to one another if an entirety of the first material is purged from within the reaction chamber prior to provision of the second material within the reaction chamber.

Referring next to FIG. 2, a process of the present invention can include the shown reaction sequence within a reaction chamber (such as, for example, the reaction chamber of FIG. 11). Specifically, a first metal-containing precursor ($M_1$) is flowed into the reaction chamber at an initial step 40. The metal contained within the first metal-containing precursor can be referred to as a first metal. The first metal-containing precursor forms a deposition over a substrate which has previously been provided within the chamber. The deposition comprises the first metal and can correspond to a substantially saturated, or entirely saturated, monolayer; and/or can correspond to a chemisorbed material.

The reaction chamber is subsequently subjected to a purge at the processing step 50 to remove substantially all, or entirely all, of the first metal-containing precursor from within the reaction chamber.

Subsequently, a second metal-containing precursor ($M_2$) is flowed into the reaction chamber. The metal of the second metal-containing precursor can be referred to as a second metal, and is different from the first metal. A component of the second metal-containing precursor interacts with the deposit formed from the first metal-containing precursor so that some of the second metal is sorbed into the layer comprising the first metal. In other words, a material comprising both the first and second metals is formed over the substrate. The incorporation of the component of the second metal-containing precursor into the layer initially formed from the first metal-containing precursor can be considered integrating a component of the second metal-containing precursor into the layer comprising the first metal, and in some aspects can correspond to integration of a component of the second metal-containing precursor into a substantially saturated monolayer of comprising the first metal or into a chemisorbed layer comprising the first metal.

The precursors $M_1$ and $M_2$ are provided within the reaction chamber at substantially non-overlapping times, and in some aspects at entirely non-overlapping times, relative to one another in that the precursor $M_1$ is purged from within the reaction chamber prior to provision within the chamber of the precursor $M_2$.

The next processing stage 70 is a purge to remove substantially all, or in some aspects entirely all, of the second precursor ($M_2$) from within the reaction chamber.

The next processing stage 80 comprises flow of one or more reactants into the reaction chamber. The material comprising the first and second metals is exposed to the reactants, and such changes the composition of the material.

Referring to step 90, the reactants are purged from within the reaction chamber. Such purging can remove substantially all, and in some aspects entirely all, of the reactants from within the reaction chamber. The processing of FIG. 2 can be considered to correspond to a single iteration of a processing sequence, and such iteration can be repeated multiple times to form a desired composition to a desired thickness.

In some aspects, the invention can comprise processes containing at least one sequence which consists of the iteration of FIG. 2. In other words, the processes include a sequence of $M_1$-purge-$M_2$-purge-reactant-purge, without any additional steps being provided between those of the shown sequence. Such aspects can include other steps before or after the shown sequence in which precursors and/or reactants are flowed into the reaction chamber.

The metals utilized in the precursors of FIG. 2 can be any suitable metals, and in particular aspects one or both of the first and second metals will be selected from the group consisting of aluminum, hafnium, lanthanides, niobium, tantalum, titanium, yttrium and zirconium. In some aspects, one of the first and second metals can correspond to hafnium and the other can correspond to aluminum. The precursor comprising the aluminum can be TMA and the precursor comprising the hafnium can be TMEAH. The reactant can comprise oxygen (such as, for example, ozone) to form one or both of aluminum oxide and hafnium oxide. Alternatively, the reactant can comprise nitrogen (such as, for example, ammonia, hydrazine, monomethyl hydrazine, dimethyl hydrazine, etc.) to form one or both of aluminum nitride and hafnium nitride. As another example, the reactant can comprise silicon to form one or both of aluminum suicide and hafnium silicide.

In other exemplary processing, one of the first and second metals can be titanium and the other can be aluminum. The precursor for the titanium can be $TiCl_4$, and the precursor for the aluminum can be TMA. The reactant can comprise nitrogen (such as, for example, ammonia, hydrazine, monomethyl hydrazine, dimethyl hydrazine, etc.) and can be utilized to form one or both of aluminum nitride and titanium nitride from the composition comprising the first and second metals. Accordingly, exemplary pulse sequences can be $TiCl_4$-TMA-$NH_3$ and TMA-$TiCl_4$—$NH_3$.

A further exemplary aspect of the present invention is described with reference to FIGS. 3-6. Referring initially to FIG. 3, a construction 100 is illustrated at a preliminary processing stage. Construction 100 comprises a substrate 102. The substrate can be an electrically insulative material, electrically conductive material, or semiconductive material. The substrate is provided within a reaction chamber (not shown in FIG. 3, but such reaction chamber can correspond to, for example, the chamber 200 of FIG. 11).

Referring to FIG. 4, a first precursor 104 is provided within the reaction chamber to form a material 106 over substrate 102. First precursor 104 can be a metal-containing precursor, or a precursor which does not contain metal, such as, for example, TDMAS. Material 106 can correspond to, for example, a substantially saturated monolayer and/or to a chemisorbed first species formed from the first precursor.

The first precursor is purged from within the reaction chamber. Subsequently, construction 100 is exposed to a second precursor 108 which alters the layer 106 (FIG. 4) to change the composition of the layer. Specifically, a component or species from the second precursor integrates within the layer 106 (FIG. 4) to form a new composition corresponding to layer 110. Such new composition includes components or species from both of the first and second precursors 104 (FIG. 4) and 108.

Figure 6:
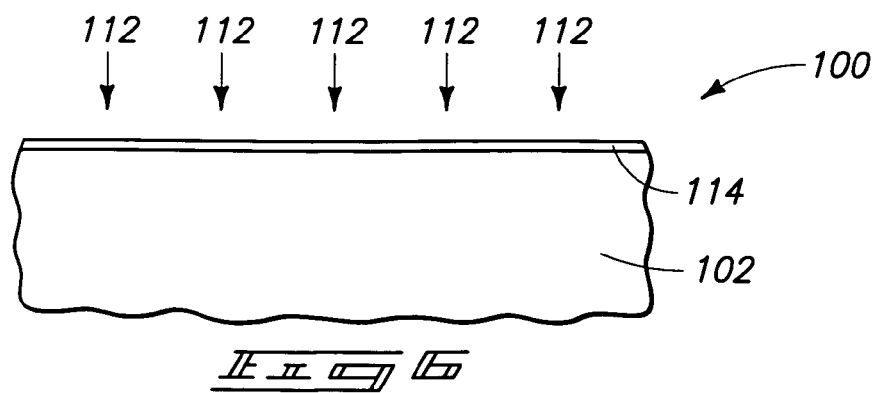
FIG. 6 is a view of the FIG. 3 substrate shown at a processing stage subsequent to that of FIG. 5.

The second precursor is purged from within the reaction chamber, and subsequently construction 100 is exposed to a reactant 112 as shown in FIG. 6. Reactant 112 reacts with one or both of the species present within layer 110 (FIG. 5) to convert the layer to a new composition 114. The new composition can correspond to, for example, an oxide, nitride or silicide, as discussed previously. Reactant 112 can subsequently be purged from within the reaction chamber, and the processing of FIGS. 3-6 can be repeated to stack multiple layers 114 on top of one another to form the composition of layer 114 to a desired thickness over substrate 102.

Methodology of the present invention can be utilized during fabrication of numerous semiconductor devices, including, for example, capacitor devices. Exemplary processing which can be utilized for forming capacitor devices is described with reference to FIGS. 7-10.

Figure 7:
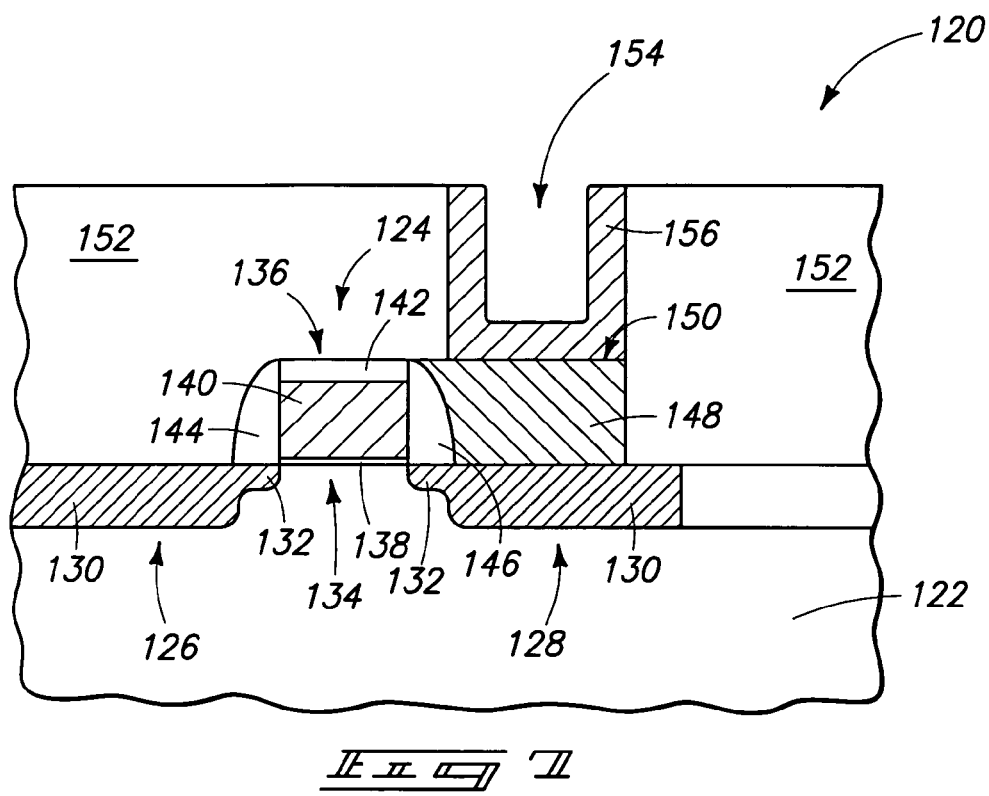
FIG. 7 is a diagrammatic, cross-sectional view of a semiconductor wafer fragment at a preliminary processing stage of an aspect of the present invention.

Referring initially to FIG. 7, a semiconductor wafer fragment 120 is shown at a preliminary processing stage. Fragment 120 comprises a semiconductor substrate 122. Substrate 122 can comprise, for example, monocrystalline silicon lightly doped with background p-type dopant.

A transistor device 124 is shown supported by substrate 122. Device 124 comprises a pair of source/drain regions 126 and 128 extending into substrate 122. The source/drain regions each include a heavily-doped region 130 extending relatively deeply into substrate 122 and a lightly-doped region 132 extending less deeply into substrate 122 than the heavily-doped region. A channel region 134 is between the source/drain regions 126 and 128, and a transistor gate 136 is over the channel region. Transistor gate 136 includes an insulative material 138 (which can be, for example, silicon dioxide, and can be referred to as gate oxide), a conductive material 140 over the insulative material (the conductive material can comprise one or more layers, and in particular aspects will comprise conductively-doped silicon and/or various metals), and an electrically insulative cap 142 over the conductive material (the insulative cap 142 can comprise, for example, silicon nitride and/or silicon dioxide).

A pair of sidewall spacers 144 and 146 extend along sidewalls of gate 124 and over lightly-doped regions 132. Spacers 144 and 146 can comprise any suitable electrically insulative material, including, for example, silicon dioxide and/or silicon nitride. Transistor structure 124 is an exemplary conventional structure, and can be fabricated using conventional methodologies. Other transistor structures can be utilized in place of transistor structure 124.

An electrically conductive pedestal 148 is provided over source/drain region 128. Pedestal 148 can comprise any suitable electrically conductive material, including, for example, conductively-doped silicon and/or various metals. Pedestal 148 has an upper surface 150 which defines an electrical node. It is to be understood that pedestal 148 is optional. If pedestal 148 is eliminated, then the electrical node can be considered to be an upper surface of the diffusion region corresponding to source/drain region 128.

An electrically insulative material 152 is provided over transistor 124, and an opening 154 is formed through insulative material 152 to expose electrical node 150. Insulative material 152 can comprise any suitable material, including, for example, borophosphosilicate glass (BPSG). A conductive material 156 is provided within opening 154. Conductive material 156 can comprise any suitable material, or combination of materials, and in particular aspects can comprise one or more of silicon and various metals. Conductive material 156 has an exposed surface within opening 154. Such exposed surface is shown smooth, but it is to be understood that the surface could also be roughened in accordance with various technologies. For instance, conductive material 156 can include hemispherical grain silicon, and the exposed surface can correspond to a rugged surface of the hemispherical grain silicon.

Figure 8:
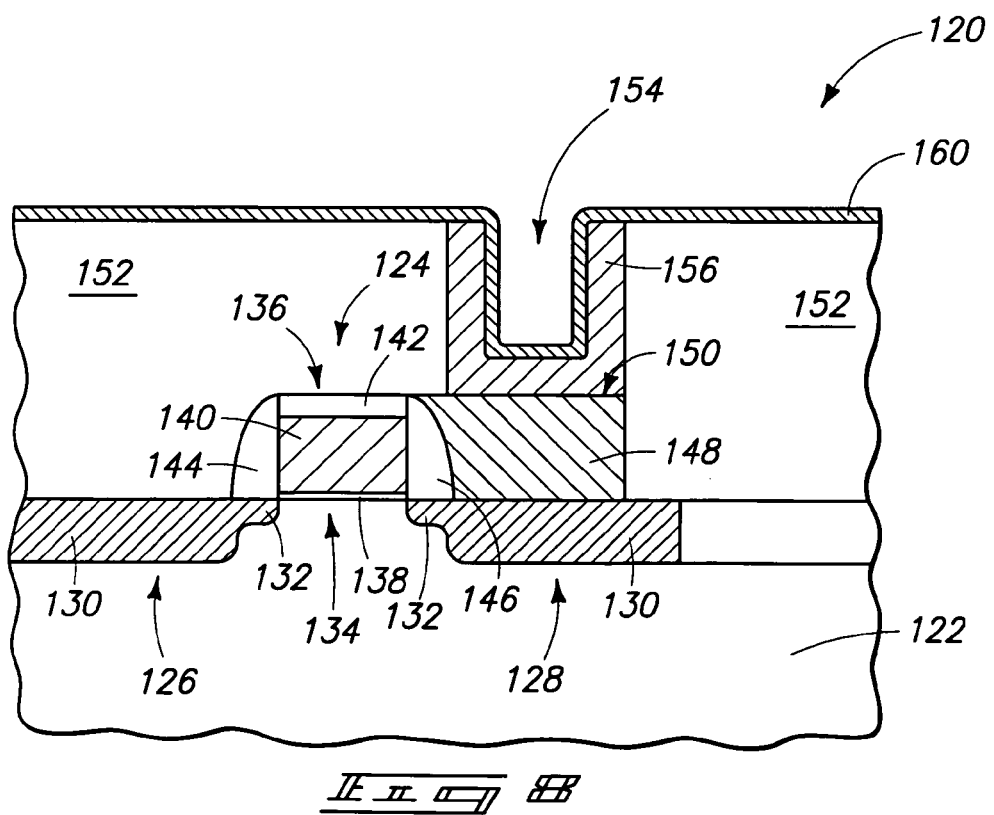
FIG. 8 is a view of the FIG. 7 fragment shown at a processing stage subsequent to that of FIG. 7.

Referring to FIG. 8, a material 160 is formed over insulative material 152 and within opening 154. Material 160 can comprise a mixture of metals, and can be formed by providing two or more metal-containing precursors within a reaction chamber at substantially non-overlapping times relative to one another in accordance with the processing of FIG. 2, and accordingly can correspond to a material at the processing stage 70 of the FIG. 2 processing sequence. In particular aspects, material 160 will comprise a mixture of aluminum-containing species and hafnium-containing species. Accordingly, material 160 can be formed with a processing sequence comprising TMA-purge-TMEAH-purge; or TMEAH-purge-TMA-purge. The material 160 is shown as an electrically conductive material at the processing stage of FIG. 8.

Figure 9:
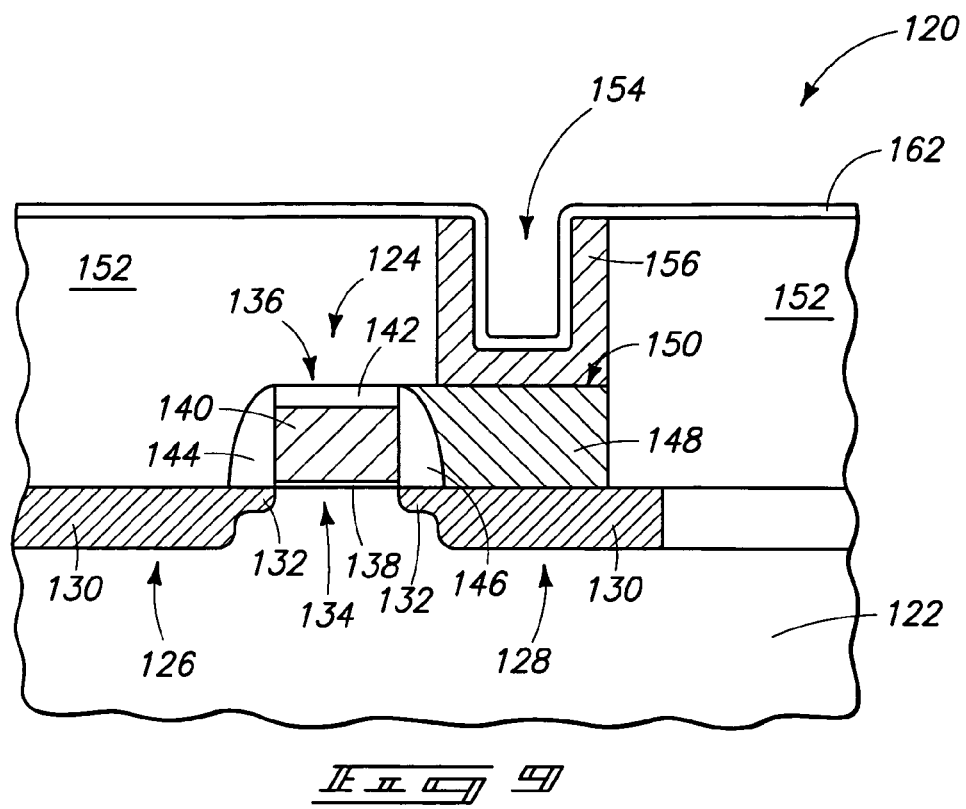
FIG. 9 is a view of the FIG. 7 fragment shown at a processing stage subsequent to that of FIG. 8.

Referring to FIG. 9, material 160 (FIG. 8) is exposed to an appropriate reactant to convert the material to an electrically-insulative composition 162. Such conversion can be accomplished by exposing material 160 to, for example, an oxygen-containing reactant (such as ozone) to oxidize the metals within layer 160 and thereby convert the layer to the dielectric composition 162. If layer 160 comprises hafnium and aluminum, layer 162 can comprise, consist essentially of, or consist of hafnium oxide and aluminum oxide.

Figure 10:
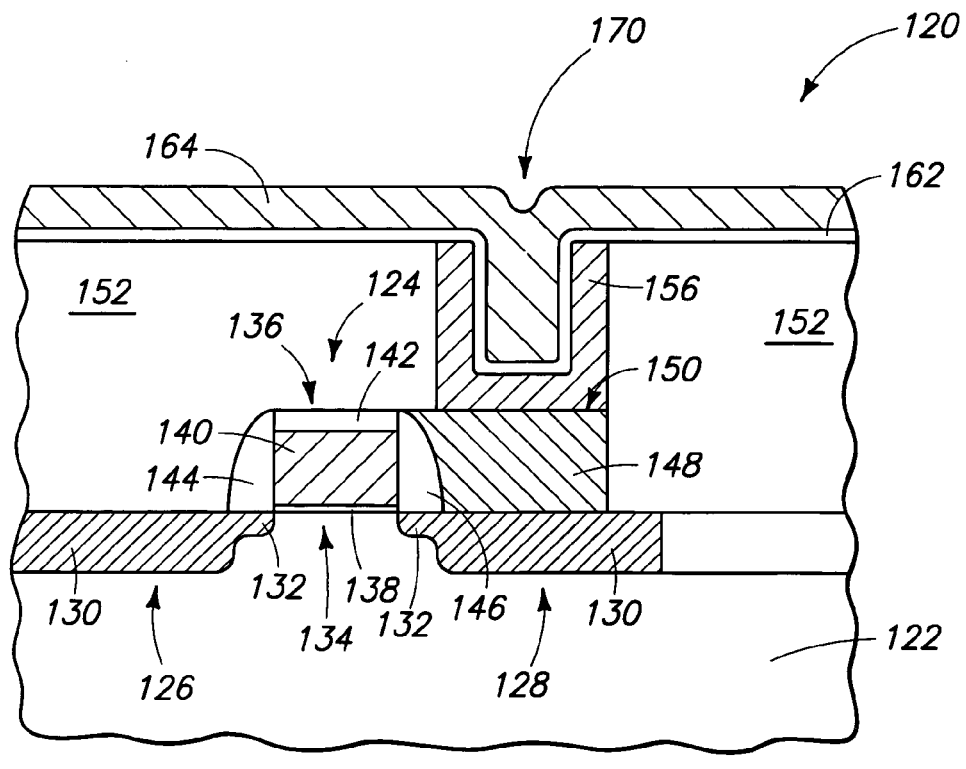
FIG. 10 is a view of the FIG. 7 fragment shown at a processing stage subsequent to that of FIG. 9.

Referring next to FIG. 10, an electrically-conductive material 164 is formed over dielectric composition 162. Material 164 can comprise any suitable electrically conductive species or combination of species, including, for example, metal and/or conductively-doped silicon.

The layers 156, 162 and 164 together form a capacitor construction 170. Specifically, conductive layer 156 corresponds to a first electrode capacitor construction, conductive layer 164 corresponds to a second electrode of the capacitor construction, and layer 162 corresponds to a dielectric between the first and second capacitor electrodes. The first and second capacitor electrodes are capacitively connected with one another through the dielectric layer. The capacitor construction is electrically connected with source/drain region 128. In other processing (not shown) a bit line can be electrically connected with source/drain region 126 so that the capacitor is incorporated into a dynamic random access memory (DRAM) cell.

The processing of FIGS. 7-10 describes the dielectric material 162 as being formed utilizing a processing sequence of the present invention. It is to be understood, however, that processing of the present invention can alternatively or additionally be utilized to form at least part of one or both of electrodes 156 and 164. Specifically, processing of the present invention can be utilized to form conductive materials. For instance, it is common to utilize metal nitrides (such as, for example, titanium nitride) in capacitor electrode constructions. One or both of electrodes 156 and 164 can comprise at least a portion formed from titanium nitride, with such titanium nitride being formed with a processing sequence utilizing exposure of a composition containing titanium and aluminum to a nitrogen-containing reactant (such as, for example, ammonia, hydrazine, monomethyl hydrazine, dimethyl hydrazine, etc.) to form a material comprising, consisting essentially of, or consisting of titanium nitride and aluminum nitride. The composition containing titanium and aluminum can be formed with a processing sequence of FIG. 2, with $M_1$ corresponding to either a titanium-containing precursor or an aluminum-containing precursor and $M_2$ corresponding to the other of the titanium-containing precursor and the aluminum-containing precursor. The titanium-containing precursor can be, for example, $TiCl_4$, and the aluminum-containing precursor can be TMA. In other processing, one or both of conductive materials 156 and 164 can comprise a silicide formed in accordance with a processing sequence of the present invention (such as, for example, FIG. 2). In such aspect, a composition can be formed from the precursors $M_1$ and $M_2$, and subsequently such composition can be exposed to a silicon-containing precursor to convert at least one metal of the composition to a desired silicide.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a material over a substrate, comprising at least one iteration of the following sequence within a reaction chamber:
   utilizing a first precursor to form a first species comprising a first metal selected from the group consisting of aluminum, lanthanides, niobium, tantalum, yttrium and zirconium across at least a portion of the substrate;
   prior to providing any reactant, utilizing a second precursor within the reaction chamber, in the substantial absence of the first precursor, to form a second species in contact with the first species, the second precursor having a different composition than the first precursor and comprising a second metal selected from the group consisting of aluminum, hafnium, lanthanides, niobium, tantalum, titanium, yttrium and zirconium; and
   providing a reactant within the reaction chamber, in the substantial absence of the first and second precursors, and reacting said reactant with at least one of the first and second species.

2. The method of claim 1 wherein the first species comprises aluminum and the second species comprises hafnium.

3. The method of claim 1 wherein the first precursor is $TiCl_4$ and the second precursor is trimethyl aluminum.

4. The method of claim 3 wherein the first species comprises titanium, the second species comprises aluminum, the reactant comprises nitrogen, and the reacting forms aluminum nitride and titanium nitride.

5. The method of claim 4 wherein the reactant includes one or more of ammonia, hydrazine, monomethyl hydrazine and dimethyl hydrazine.

6. The method of claim 1 wherein the first precursor is trimethyl aluminum and the second precursor is $TiCl_4$.

7. The method of claim 6 wherein the first species comprises aluminum, the second species comprises titanium, the reactant comprises nitrogen, and the reacting forms aluminum nitride and titanium nitride.

8. The method of claim 7 wherein the reactant includes one or more of ammonia, hydrazine, monomethyl hydrazine and dimethyl hydrazine.

9. The method of claim 1 wherein the substrate includes a first capacitor electrode, wherein the at least one iteration forms a dielectric material over the first capacitor electrode, and further comprising forming a second capacitor electrode over the dielectric material and capacitively connected with the first capacitor electrode.

10. The method of claim 9 wherein the dielectric material comprises hafnium oxide and aluminum oxide.

11. The method of claim 1 wherein the at least one iteration forms a metal nitride composition, and further comprising:
   forming a pair of capacitor electrodes and a dielectric material over the substrate, the capacitor electrodes being separated from one another by the dielectric material; and
   incorporating the metal nitride composition into one of the capacitor electrodes.

12. A method of forming a material over a substrate, comprising at least one iteration of the following sequence within a reaction chamber:
   utilizing a first precursor to form a first species across at least a portion of the substrate;
   prior to providing any reactant, utilizing a second precursor within the reaction chamber, in the substantial absence of the first precursor, to form a second species in contact with the first species, the second precursor having a different composition than the first precursor;
   providing a reactant within the reaction chamber, in the substantial absence of the first and second precursors, and reacting said reactant with at least one of the first and second species; and
   wherein the first species comprises aluminum and the second species comprises titanium.

13. A method of forming a material over a substrate, comprising at least one iteration of the following sequence within a reaction chamber:

utilizing a first precursor to form a first species across at least a portion of the substrate;

prior to providing any reactant, utilizing a second precursor within the reaction chamber, in the substantial absence of the first precursor, to form a second species in contact with the first species, the second precursor having a different composition than the first precursor;

providing a reactant within the reaction chamber, in the substantial absence of the first and second precursors, and reacting said reactant with at least one of the first and second species; and wherein the first precursor is trimethyl aluminum and the second precursor is tetrakis methylethylamido hafnium.

14. The method of claim 13 wherein the first species comprises aluminum, the second species comprises hafnium, the reactant comprises oxygen, and the reacting forms aluminum oxide and hafnium oxide.

15. The method of claim 14 wherein the reactant is $O_3$.

16. The method of claim 13 wherein the first species comprises aluminum, the second species comprises hafnium, the reactant comprises nitrogen, and the reacting forms aluminum nitride and hafnium nitride.

17. The method of claim 16 wherein the reactant includes one or more of ammonia, hydrazine, monomethyl hydrazine and dimethyl hydrazine.

18. The method of claim 13 wherein the first species comprises aluminum, the second species comprises hafnium, the reactant comprises silicon, and the reacting forms aluminum silicide and hafnium silicide.

* * * * *